United States Patent [19]

Alessandrini et al.

[11] 4,366,337
[45] Dec. 28, 1982

[54] P-SI/N-CDS HETEROJUNCTION PHOTOVOLTAIC CELLS

[75] Inventors: Paolo Alessandrini, Rome; Lucio De Angelis, Palombara Sabina; Fabrizio Galluzzi, Rome; Francesco Losciale, Rome; Ernesto Scafe', Rome, all of Italy

[73] Assignee: E.N.I. Ente Nazionale Idrocarburi, Rome, Italy

[21] Appl. No.: 177,597

[22] Filed: Aug. 13, 1980

[30] Foreign Application Priority Data

Sep. 10, 1979 [IT] Italy .................. 25569 A/79

[51] Int. Cl.³ .................. H01L 31/06; H01L 31/18
[52] U.S. Cl. .................. 136/258; 136/260; 136/261; 357/30; 427/74
[58] Field of Search .................. 136/258, 260, 261; 357/30; 427/74

[56] References Cited

PUBLICATIONS

H. Okimura et al., "Electrical and Photovoltaic Properties of CdS-Si Junctions," *Japan J. Appl Phys.*, vol. 9, pp. 274-280 (1970).

F. M. Livingstone et al., "Si/CdS Heterojunction Solar Cells," *J. Phys. Di. Appl. Phys.*, vol. 10, pp. 1959-1963 (1977).

M. Arienzo et al., "Single Crystal Solar Cell Heterojunctions by Chemical Vapor Deposition of CdS," pp. 361-369 in *Proceedings 2nd European Photovoltaic Solar Energy Conf.* (1979), Reidel Pub. Co.

N. Romeo et al., "Growth and Properties of Low Resistivity CdS Films," *Thin Solid Films*, vol. 55, pp. 413-419 (1978).

*Primary Examiner*—Aaron Weisstuch
*Attorney, Agent, or Firm*—Morgan, Finnegan, Pine, Foley & Lee

[57] ABSTRACT

The invention provides photovoltaic cells of new design in which the two semiconductors have lattice parameters which differ by more than 5%. The n-type semiconductor material is constituted by high conductivity CdS doped with indium in a percentage higher than 1%, and the p-type semiconductor material is constituted by Si. The active surface of said cells is equal to or greater than 1.5 cm².

7 Claims, 17 Drawing Figures

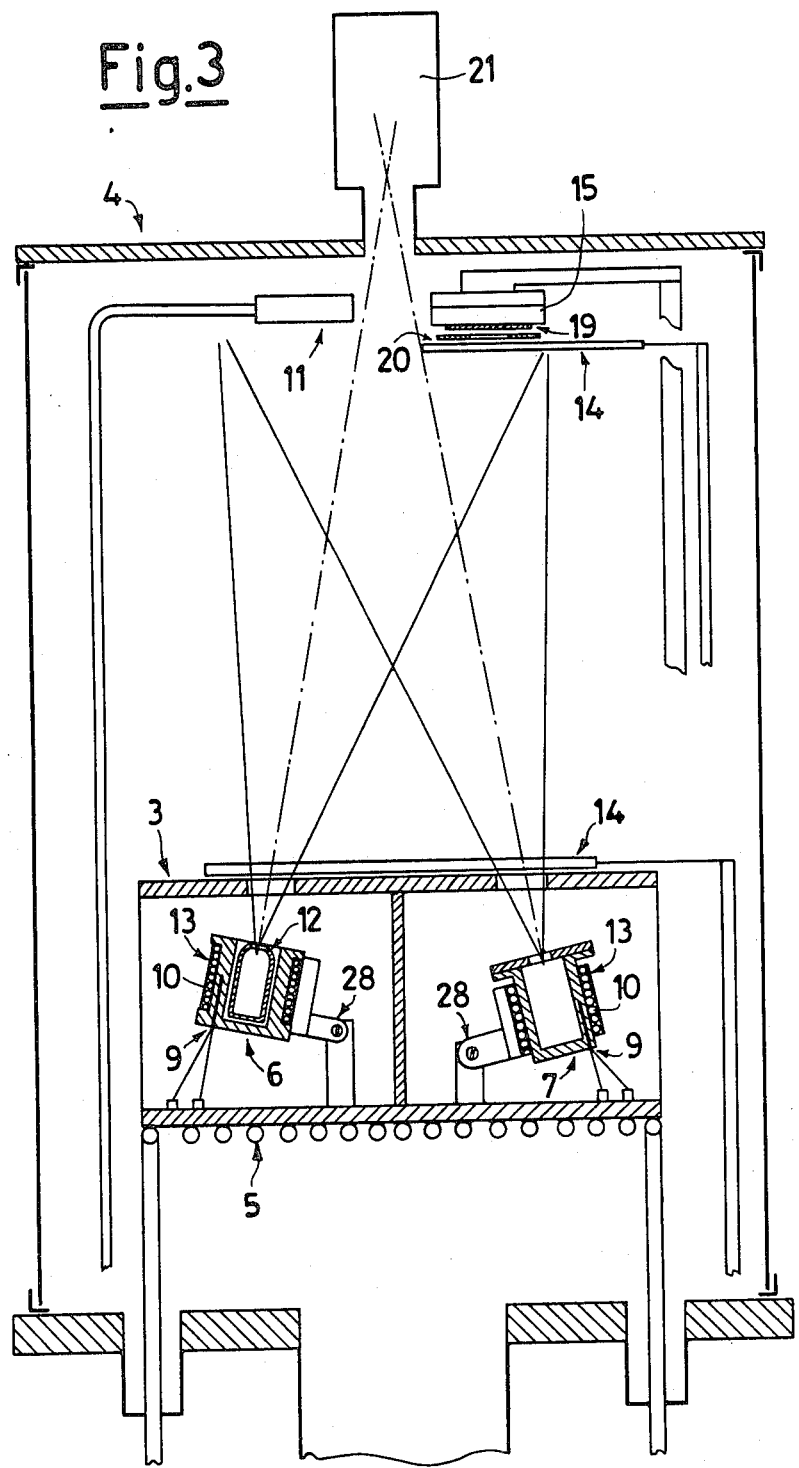

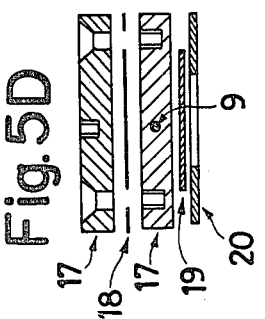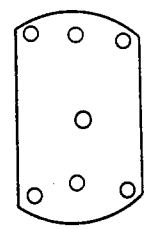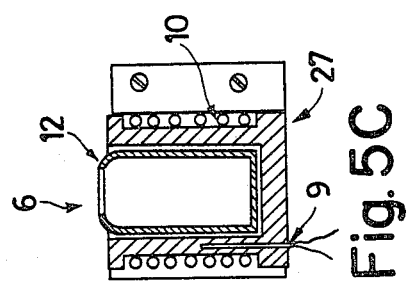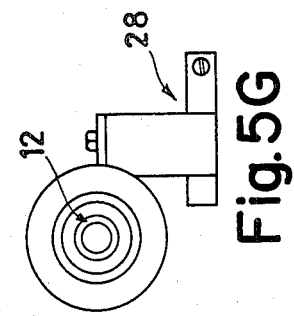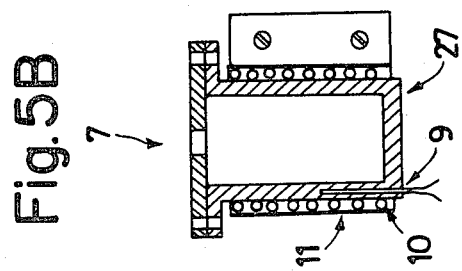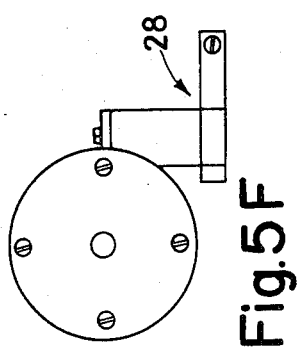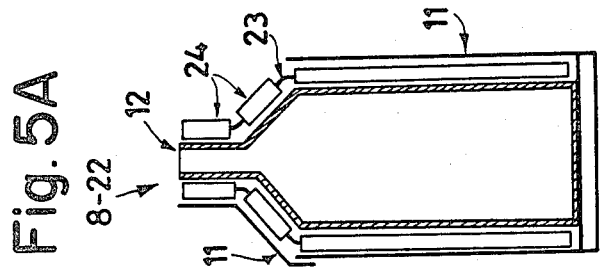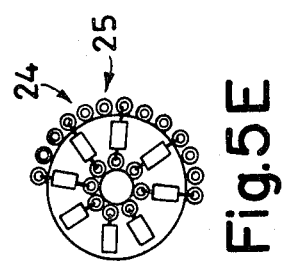

P-SI/N-CDS HETEROJUNCTION PHOTOVOLTAIC CELLS

This invention relates to photovoltaic cells of new design. One of the most promising method of constructing solar cells for terrestrial use consists of placing two semiconductors of different chemical structure into intimate contact. It is generally considered that in order to demonstrate good electrical and photovoltaic performance, the two materials constituting such a heterojunction must generally possess a crystalline structure having lattice parameters which are very close to each other in order to minimise the defect density at the interface. Devices have been constructed within this type of optical arrangement, such as n-CdS/p-InP (S. Wagner, J. L. Shay, K. T. Bachmann, E. Buchler, Appl.Phys. Lett. 26, 229 (1975)), and n-CdS/p-CuInSe$_2$ (S. Wagner, J. L. Shay, P. Migliorato and H. M. Kasper, Appl. Phys. Lett. 25, 434 (1974)), in which the lattice parameters of the materials used differ from each other by less than 1%, and which show solar energy conversion efficiencies equal to or greater than 12% (under AM1 or AM2 illumination conditions). In contrast, in heterostructures constructed of semiconductor materials having lattice parameters which differ considerably from each other, conversion efficiencies of less than 9-10% are generally obtained.

In particular, for the heterostructure constituted by n-CdS on p-Si, in which the difference between the lattice parameters is 7%, the best conversion efficiencies reported lie between 5.5% (H. Okimura and R. Kondo, Jap. J. Appl. Phys. 9, 274 (1970)) and 7% (F. M. Livingstone, W. M. Tsang, A. J. Barlow, R. M. De La Rue and W. Duncan, J. Phys. D, 10, 1959 (1977)).

Moreover, in both these cases, the results relate to devices of extremely small area, of less than or equal to 1 mm$^2$. It has now been surprisingly found, and constitutes the subject matter of the present invention, that it is possible to provide n-CdS/p-Si heterojunctions having high conversion efficiencies ($\geq$10%) on large area devices (greater than 1.5 cm$^2$) in spite of the considerable difference between the lattice constants of the two materials, which exceeds 5%. In such cells, the n-type semiconductor material is constituted by CdS having a conductivity equal to or greater than 10 $\Omega^{-1}$cm$^{-1}$, and containing indium in a percentage higher than 1%.

The p-type semiconductor material is constituted by Si having a resistivity variable between 100 and 0.01 $\Omega$cm, either monocrystalline or polycrystalline. The best results are obtained using silicon having a resistivity of between 10 and 0.1 $\Omega$cm. On the silicon surface on which CdS is deposited there can be an insulating layer, such as SiOx having a thickness not exceeding 20 angstrom units. More specifically, it has been found that n-CdS/p-Si heterojunctions formed by the evaporation of indium-doped CdS on single silicon crystals have a uniform quantum efficiency of about 75-80% for wavelengths between 0.6 and 1 $\mu$m, short-circuit currents of 25-30 mA/cm$^2$ under AM1 solar conditions, and open circuit voltages of between 480 and 570 mV, and fill factors of 0.60-0.70. Solar energy conversion efficiencies of 10% have been obtained in prototypes with a useful area of 1.5 cm$^2$ (net of the front contact area), and efficiencies of 13% and over can be obtained in optimised devices.

The above characteristics refer to devices without a non-reflecting coating. As a matter of fact, the CdS films exhibit, as themselves, antireflective properties, by decreasing the reflectivity (average) of silicon from 30%-35% to about 15% in the case of thick CdS films and to about 15% in the case of very thin films (thickness below 1000 angstrom units). The devices described heretofore demonstrate considerable adhesion and thermal stability properties, as has been shown by repeated thermal cycles between 400° and 100° K., carried out on experimental prototypes.

In another application, the CdS is grown on polycrystalline substrates of p-type silicon. Efficiencies of about 6% have been attained in laboratory prototypes, and efficiencies over 10% can be obtained in optimised devices.

The invention is explained with reference to the accompanying drawings wherein:

FIG. 3 is a diagrammatic sectional view an alternative bell configuration;

FIGS. 5A, 5B and 5C show crucibles for use in the bell of FIG. 3;

FIG. 5D shows a sample holder for use in the bell of FIG. 3;

FIG. 5E is a schematic representation of an array of quartz tubes for the crucible of FIG. 5A;

FIGS. 5F and 5G show crucible positioning systems for the bell of FIG. 3;

FIG. 5H is a plan view of sample holders for the bell of FIG. 3;

The electrical and photovoltaic characteristics of the device were measured in experimental prototypes constructed in the manner described hereinafter. Junctions having an area of 2 cm$^2$, when in the dark and at ambient temperature have electrical characteristics of rectifying type, with a diode quality factor of between 1.1 and 1.4, a direct resistance of between 0.5 and 5$\Omega$ and an inverse resistance of between 10$^5$ and 10$^6\Omega$.

Figure 7:
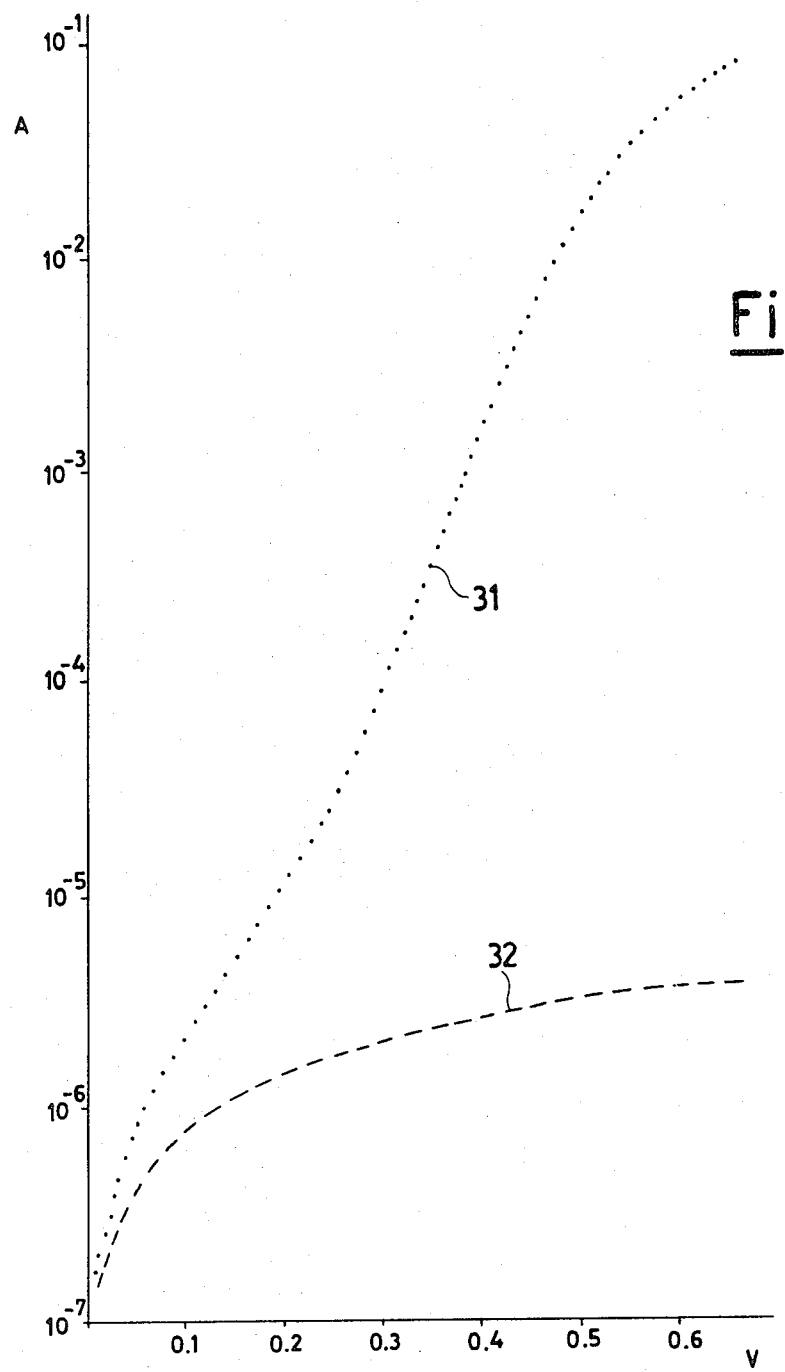
FIG. 7 shows a typical current voltage characteristic for a CdS device.

FIG. 7 shows a typical current-voltage characteristic curve in the absence of illumination and at a temperature of 300° K., for a heterojunction of 2 cm$^2$ constituted by p-doped monocrystalline silicon having a thickness of 300 $\mu$m and a resistivity of 1$\times$10$^{-2}$ $\Omega$cm. When directly biased by a current greater than 10$^{-4}$ A, an exponential characteristic curve is obtained with a quality factor of 1.35 and a series resistance of 1.4$\Omega$ (31). Under reverse bias (32) there is a saturation current of about 4$\times$10$^{-6}$ A and an inverse resistance of about 1.7$\times$10$^5\Omega$.

The capacity of the devices constructed follows the usual relationship for step junctions, according to which the inverse of the square of the capacity is proportional to the applied voltage (under reverse bias), and the measured values correspond to a concentration of impurities, in the p region, of $10^{15}$ to $10^{16}$ cm$^{-3}$, which is in excellent agreement with the resistivity of the silicon used.

On illuminating the junctions through the CdS layer by a source constituted by a filtered quartz-iodine lamp, which simulates the solar spectrum and delivers a luminous power of 100 mW/cm$^2$, open circuit voltages of between 480 and 570 mV and short circuit currents of between 35 and 45 mA are typically observed on an effective area of 1.5 cm$^2$, without using other non-reflecting layers on the CdS and without optimising the grid contact.

Figure 6:
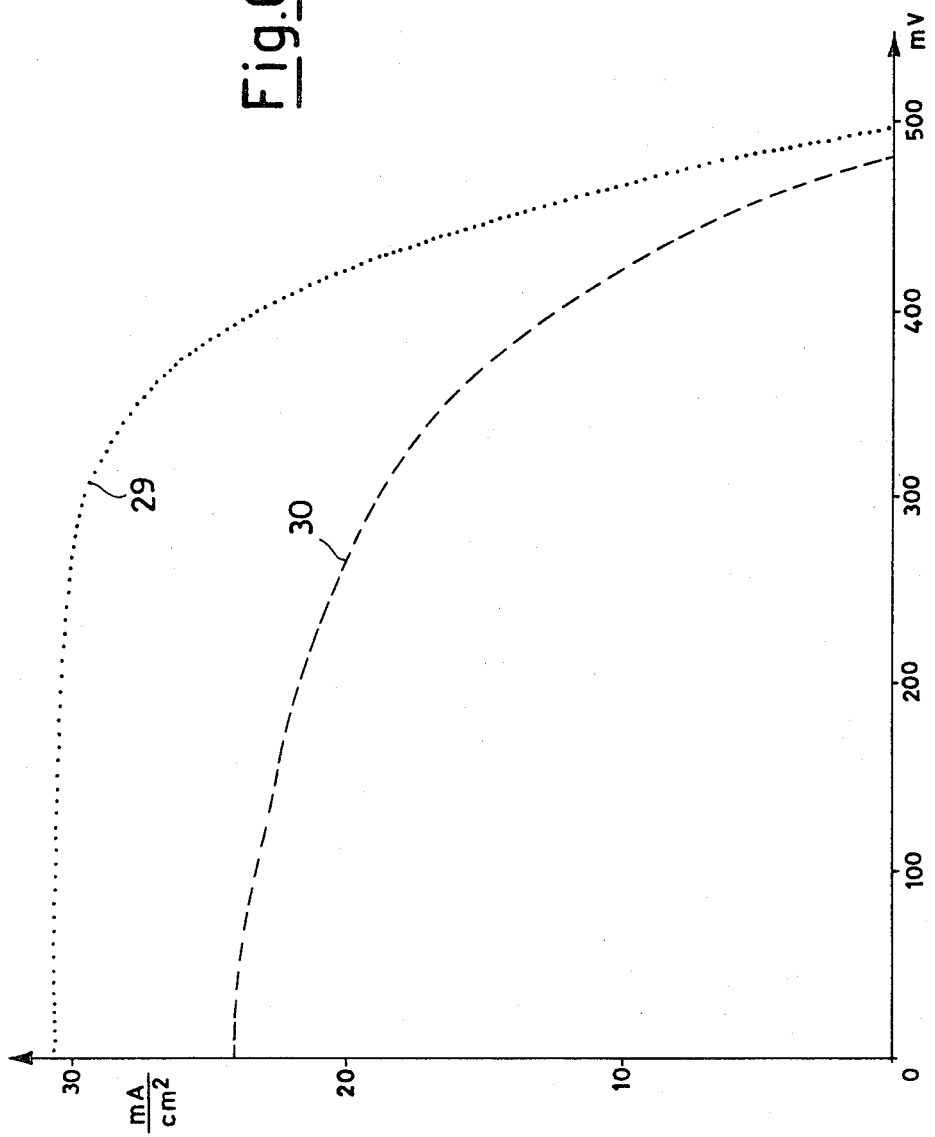
FIG. 6 shows the photovoltaic characteristics of two experimental CdS devices.

FIG. 6 shows the photovoltaic characteristics of the two experimental devices of active area 1.5 cm$^2$, constituted by n-CdS (thickness 3.3 μm, resistivity $6 \times 10^{-3}$ Ωcm) on monocrystalline p-Si (29) (thickness 300 μm, resistivity 10 Ωcm), and n-CdS (thickness about 2 μm, resistivity about 0.1 Ω cm) on polycrystalline Wacker SILSO p-Si (30) (thickness 400 μm, resistivity 5 Ωcm).

The first device shows an open circuit voltage of 495 mV, a short circuit current of 30.5 mA/cm$^2$, and a fill factor of 0.54, corresponding to a solar energy conversion efficiency (under AM1 solar conditions) of 9.6%.

The second device has an open circuit voltage of 480 mV, a short circuit current of 24 mA/cm$^2$, and a fill factor of 0.50 with a conversion efficiency of 5.7%.

Figure 8:
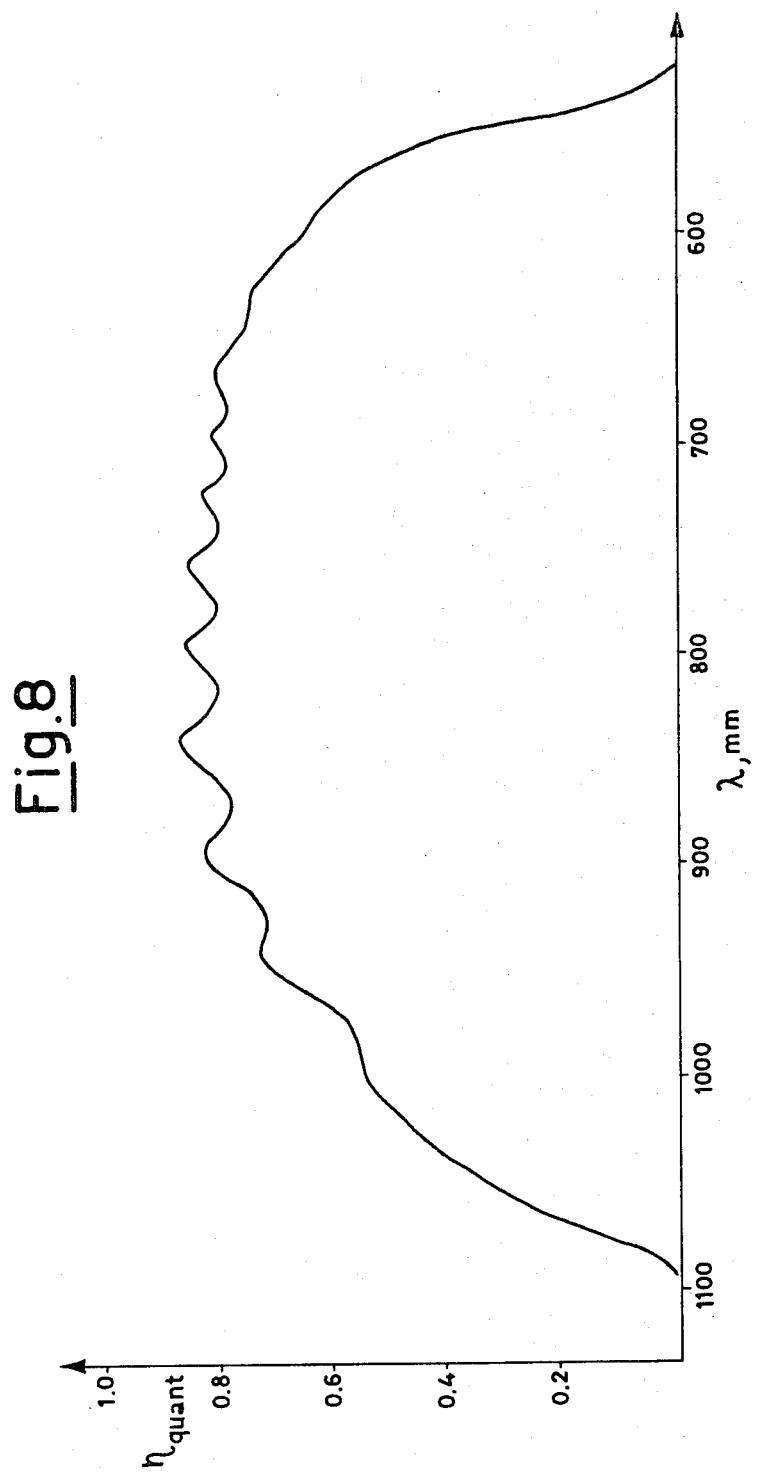
FIG. 8 shows the spectral response of a CdS device having a thin layer. For ease of reference in the ensuring description, the FIGS. 2A-B will be referred to as FIG. 2, the FIGS. 4A-B will be referred to as FIG. 4, and the FIGS. 5A-H will be referred to as FIG. 5.

The photovoltaic spectral response of the devices of the type shown in FIG. 6 is shown in FIG. 8, in which the ordinate represents the absolute quantum efficiency of the short circuit current, and the abscissa the wavelength of the luminous radiation which strikes the junction through the CdS layer. At wavelengths less than 500 nm the response is negligible, because the light is adsorbed by the surface layer of CdS and does not reach the junction. Above 530 nm the response rises rapidly, and from about 650 nm to about 930 nm it remains practically flat around a quantum efficiency value of 80%. From 930 nm the quantum efficiency reduces considerably, and disappears around 1100 nm at the silicon forbidden band energy.

The oscillating pattern shown by the spectral response of FIG. 8 is due to the interference caused by the thin layer of CdS (thickness 3.3 μm).

Photovoltaic cells having the above characteristics can be prepared by numerous methods.

PREPARATION METHODS

Of these methods, a description will now be given of the methods for preparing the device by growing cadmium sulphide n-doped with indium under vacuum on either monocrystalline or polycrystalline p-doped Wacker SILSO silicon.

SILICON TREATMENT

The silicon substrate is previously subjected to chemical attack (HF:HNO$_3$), and afterwards a film of aluminium is evaporated under vacuum on to the non-polished face.

The aluminium is then diffused into the silicon at a temperature of about 650° C. in a reducing atmosphere.

After protecting the ohmic contact thus formed with a layer of Kodak photoresist, the silicon wafer is again chemically attacked, with HF:H$_2$O. Finally, having removed the photoresist, the wafer is washed and dried, and then introduced into the vacuum installation. The ohmic contact can also be prepared by evaporating gold on the silicon surface which has been treated with HF:HNO$_3$ or with HF:H$_2$O. In the latter case, it suffices to remove the oxide layer with HF:H$_2$O prior to introducing the silicon chips in the vacuum plant.

Apparatus for growing CdS

The CdS is grown under vacuum by two main methods. One growing method is akin to that described by N. Romeo et al. in "Thin Solid Films" Vol. 43, pages L15–L17 (1977). It consists essentially of three sources for growing indium-doped cadmium sulphide under vacuum directly from the elements.

The other method is based on the evaporation of CdS from powdered cadmium sulphide placed in a crucible and of metal indium from a second crucible.

The modifications made relate to the type of sources, their temperature control, control of the rate of evaporation, and the residual atmosphere in the growth environment.

For both apparatus, the vacuum installation is of conventional type.

It consists, in order, of a chamber in which the evaporation system is disposed, a liquid nitrogen trap or an oil vapour diffusion pump, an activated alumina trap and a mechanical rotary pump. The vacuum installations are provided with automatic systems for constantly keeping the traps full of liquid nitrogen.

The operating pressures of the two installations lie between $5 \times 10^{-8}$ and $1 \times 10^{-7}$ torr.

Figure 1:
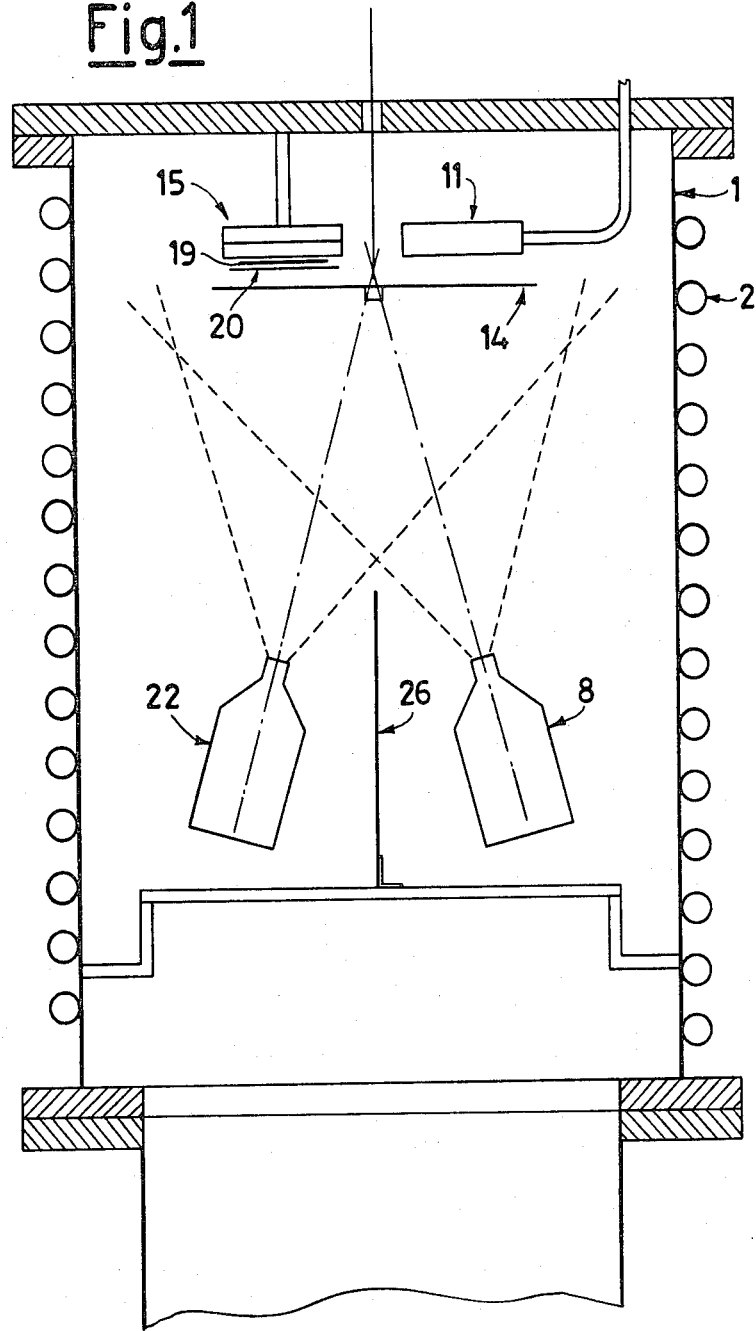
FIG. 1 is a diagrammatic view of a water-cooled bell for growth of CdS layer.
Figure 2:
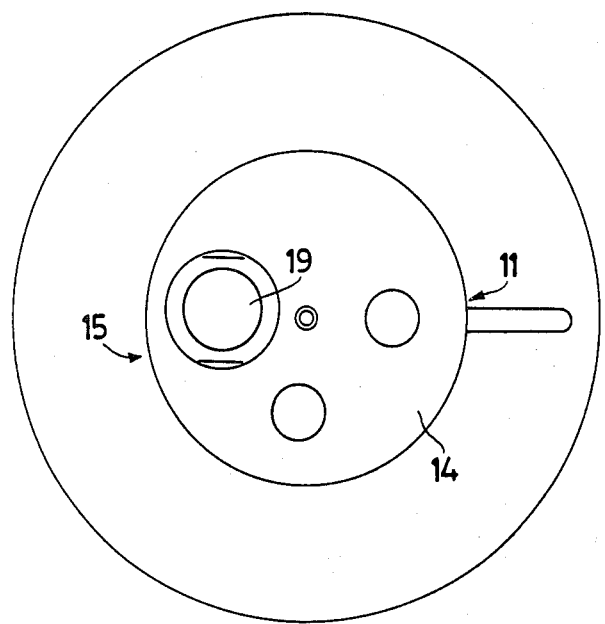
FIG. 2A is a plan view of a shutter and adjacent equipment at the top of the bell of FIG. 1.
FIG. 2B is a plan view of crucibles at the bottom of the bell of FIG. 1.
Figure 2:
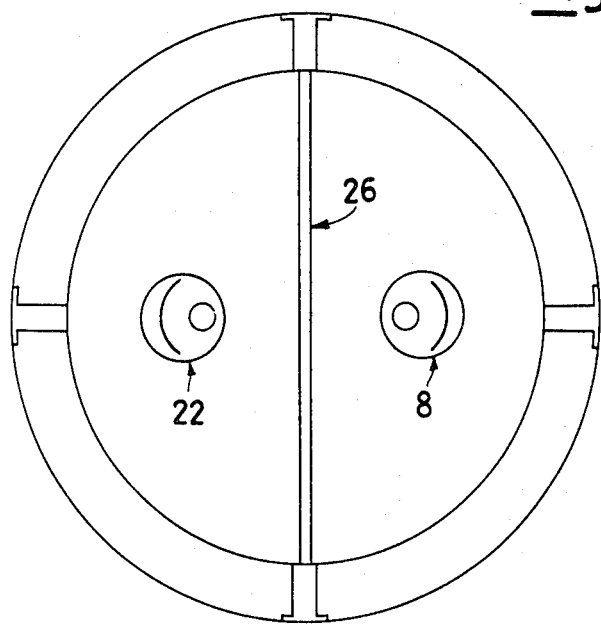

In FIGS. 1 and 2, the coil (2), wound about the chamber (1) and in which water is circulated, enables the temperature of the chamber to be kept low during the growth of the CdS films, thus causing the vapour present during growth to condense on to the walls. For the other system shown in FIGS. 3, 4 and 5 (co-evaporation of the elements), as it is not possible to degas the entire system because of the presence of the sulphur, a chamber (3) is formed inside the chamber (4), and cooled by means of a coil (5) through which liquid nitrogen flows. This innovation affords an improved control of sulphur during the film growth, such control being vital for the end properties of the CdS+indium semiconductor film.

The sources for the elements (6) (7) and (8), are positioned inside this chamber.

A piezoelectric quartz thickness monitor (11) (FIGS. 1, 2, 3 and 4) is used for measuring the thickness of the grown films and the evaporation rate, the final reading being checked afterwards by optical methods.

The resonance frequency of the piezoelectric quartz thickness monitor is read by a frequency meter connected to an automatic data acquisition system.

In this manner it is possible to measure both the absorption and desorption rates on the measuring instrument.

This facility for evaluating the total flow of molecules which reach the surface (apart from the sticking coefficient) is of considerable importance for monitoring the sulphur evaporation rate when growing the CdS from its components, and for controlling the evaporation rates used for the doping agent ($V \geqq 0.001$ Å/sec.).

Particular attention was given to manufacturing the sources and the sample holders (FIG. 5).

For the indium (i), for the cadmium (6) and for the powdered CdS (22) the crucibles are of quartz (12).

The heaters for these temperatures are of tantalum wire (23) insulated by quartz tubes (24) and arranged along the height of the crucible.

They are lined with tantalum (11) which, besides its mechanical function, has the purpose of reducing heat loss by radiation. In the case of sources operating at low temperature (sulphur (7)), the material used is aluminium (27).

All the crucibles are of adjustable position (28) in order to be able to concentrate the vapour of all the elements in the zone occupied by the sample. The system is also fitted with shutters (14) which enable stabilisation of the evaporation rates of the individual crucibles to be checked without allowing substances to reach the substrates. The screen (26) (FIGS. 1-2) serves for reducing the mutual influence between crucibles. The sample holders (15) (16) (FIG. 5), which can also be temperature-controlled within 0.1° C., consist of two aluminium plates (17) which enclose the heater (18).

The substrates (19) are put into thermal contact with the sample holder by means of the "masks" (20) which also serve for limiting the growth zone of the CdS film to about 2-3 cm$^2$.

GROWTH PROCEDURE

Evaporation from powder (FIGS. 1-2)

The ultra-pure CdS powder is heated in an oven at 120° C. for two hours before being placed in the crucible (22). The indium (6 N) is firstly degreased with carbon-tetrachloride, then attacked with 1:1 HCl, or with 1:1 HNO$_3$ and finally washed with deionised water and "electronic grade" isopropanol.

After evacuating the system to a pressure of about $10^{-6}$ torr, the system is degassed by raising the substrate (19) to a temperature of about 300° C. and the two sources (22) and (8) to 500° C.

Irradiating the sources also heats the chamber (1), raising it to about 100° C.

Having attained a pressure of the order of $2 \times 10^{-7}$ torr, water is fed into the cooling coil (2).

At this point, the temperature of the CdS source (22) is progressively raised until the required evaporation rate is attained, this being checked by rotating the shutter (14) of FIG. 2, which uncovers only the piezoelectric quartz thickness monitor for short time intervals.

The temperature of the indium source (8) is then fixed to the required value, and the temperature of the substrate (19) is fixed at 210° C.

The evaporation rate of the CdS is chosen within the range 2 to 6 Å/sec, and that of the indium in such a manner that it is over 1% of the other.

At the end of these operations, the shutter (14) is opened, and an "n" CdS film is grown having a thickness of 2-10 µm on the "p" silicon substrate (19).

On attaining the required thickness, the shutter (14) is closed, and the source heaters turned off.

The substrate is cooled to ambient temperature at a rate of 1° C./min.

After filling the bell with argon, it is opened and the sample removed.

Figure 4A:
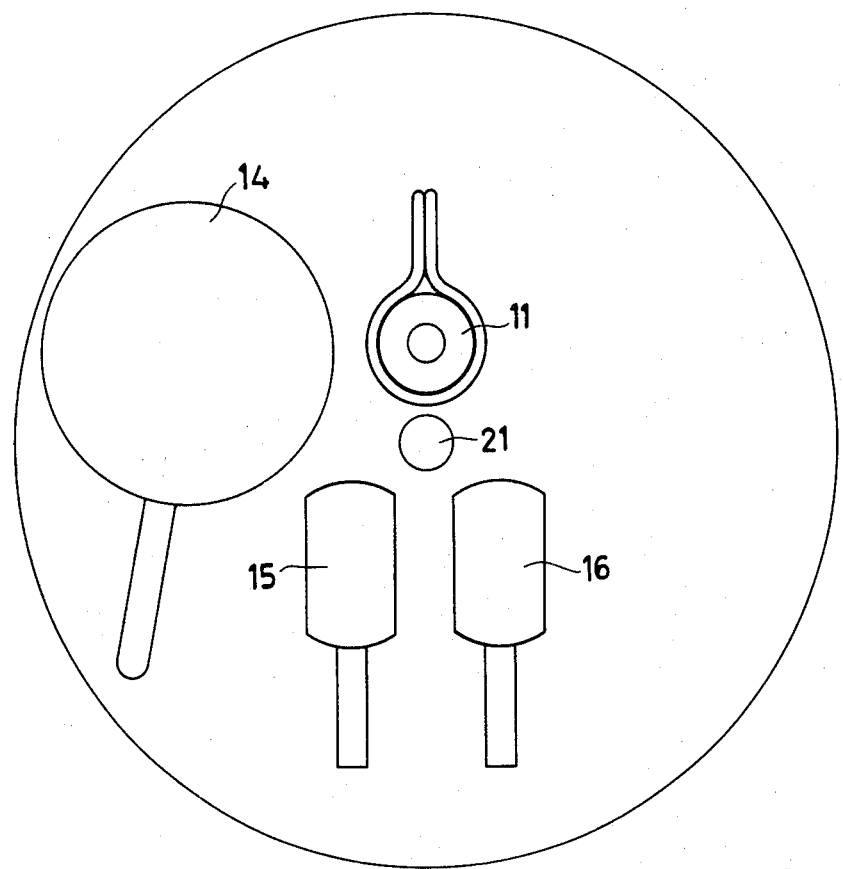
FIG. 4A is a plan view of a shutter and adjacent equipment at the top of the bell of FIG. 3.
Figure 4B:
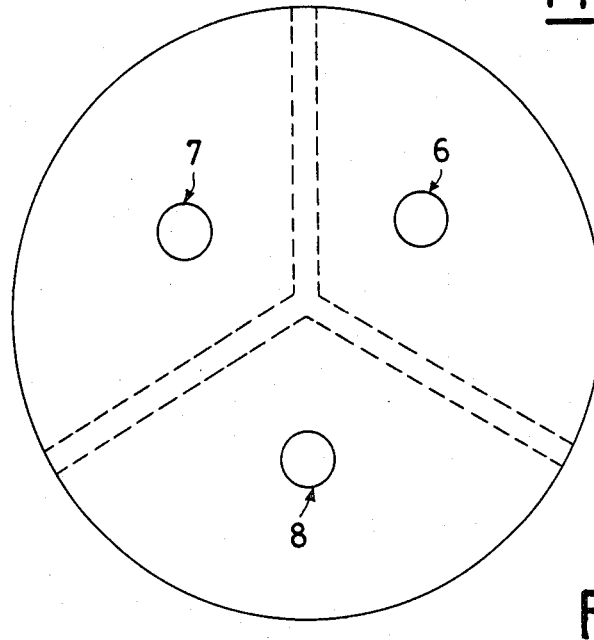
FIG. 4B is a plan view of crucibles at the bottom of the bell of FIG. 3.

Evaporation from the elements (FIGS. 3-5)

The cadmium (4 N 5) and indium (6 N), both in droplet form, are degreased with carbon tetrachloride and then chemically attacked with 1:1 HNO$_3$, or 1:1 HCl; they are then washed with deionised water and "electronic grade" isopropanol.

The sulphur (5 N) is simply ground with an agate mortar and introduced into the crucible.

After evacuating the chamber to a pressure of $10^{-6}$ torr, the elements are prefused in an argon atmosphere (500 torr) while maintaining the substrates at about 300° C.

After cooling, the system is left overnight under pumping. Before beginning growth, the chamber (3) containing the crucibles (6), (7) and (8) is cooled by circulating liquid nitrogen through the appropriate coil (5).

When the chamber (3) reaches equilibrium temperature (about −180° C.) and the residual pressure has stabilised at around $5 \times 10^{-8}$ torr, heating of the indium, sulphur and cadmium crucibles is then commenced in that order.

The sources are thus raised to the temperatures at which the evaporation rates are as required.

These rates represent a compromise between the duration of the growth process, the residual pressure and the morphology of the film. In this particular case these are fixed within the range 2-6 Å sec. (both for the sulphur and for the cadmium). In this manner, a film can be grown having a thickness of between 2 and 10 µm in about 3-4 hours. To attain these rates with the geometries used, the temperatures are:

for the sulphur: 90°-120° C.
for the cadmium: 220°-350° C.
for the indium: 650°-850° C.

For the indium, the rate is fixed at more than 1% of the sum of the sulphur and cadmium rates.

At this point, having checked the stability of these rates, the temperature of the substrates is lowered from 300° C. to 210° C., and the film growth is commenced by opening the shutters (14).

During growth a check is kept on the evaporation rate, the sulphur partial pressure (with a mass spectrometer (21)), and the resistivity of the film which grows simultaneously on a quartz substrate (16) placed next to the silicon (FIG. 4). When the chosen thickness (2-10 µm) has been reached, growth is interrupted by closing all the shutters and cooling the sources.

Before opening the bell, the substrate holders are cooled slowly (about 1° C./min) in order to prevent film fracture.

FRONTAL CONTACT

The frontal collector electrode (grid) is deposited under vacuum on the fabricated devices when they have been removed from the respective growth systems, using aluminium or indium (with indium reliable ohmic contacts are obtained which are more stable with time).

The legend relative to FIGS. 1, 2, 3, 4, 5, 6, 7 and 8 is given hereinafter. The numbers within the circles represent the parts shown on the figures.

(1) Steel chamber
(2) Cooling water circulation coil
(3) Chamber cooled with liquid nitrogen
(4) Pyrex chamber
(5) Liquid nitrogen circulation coil
(6) (7) (8) Crucibles for cadmium, sulphur and indium respectively
(9) Platinum thermometers
(10) Crucible heaters
(11) Piezoelectric quartz thickness monitor for film thickness measurement
(12) Crucible quartz containers
(13) Tantalum lining
(14) Shutters
(15) (16) Temperature-controllable sample holders

(17) Sample-holder aluminium plates
(18) Sample-holder heater
(19) Photocell substrate (monocrystalline or polycrystalline silicon)
(20) Mask for limiting the cadmium sulphide film
(21) Mass spectrometer for checking residual atmosphere
(22) Crucible for evaporating powdered cadmium sulphide
(23) Tantalum wire for heater
(24) Quartz tubes for insulating tantalum wires
(25) Thermocouples
(26) Radiation screen
(27) Aluminum container for cadmium and sulphur crucibles
(28) Crucible positioning system
(29) (30) Response curve under direct and inverse photocell illumination respectively.

We claim:

1. A photovoltaic cell comprising a region of n-type semiconductor material in intimate contact with a region of p-type semiconductor material, both regions being in contact with conducting electrodes, wherein the n-type semiconductor material and the p-type semiconductor material have lattice parameters which differ from each other by a percentage equal to or greater than 5%, the n-type semiconductor material being CdS containing more than 1% In, and the p-type semiconductor material being Si.

2. A photovoltaic cell as claimed in claim 1, wherein the p-type semiconductor material is chosen from mono- and polycrystalline Si having a resistivity of between 100 and 0.01 $\Omega$cm.

3. A photovoltaic cell according to claim 2 wherein the p-type semconductor material has a resistivity of between 10 and 0.1 $\Omega$cm.

4. A photovoltaic cell as claimed in claim 1, wherein the n-type semiconductor material is CdS having a conductivity exceeding $10\Omega^{-1} cm^{-1}$.

5. A photovoltaic cell according to any one of the claims 1, 2, or 4, wherein the n-type semiconductor material has been grown by co-evaporation of the elements Cd, S, In on areas equal to, or wider than, 1.5 cm$^2$.

6. A photovoltaic cell according to any one of the claims 1, or 4 wherein the n-type semiconductor material has been grown by co-evaporation of the substances CdS and In on areas equal to, or wider than 1.5 cm$^2$.

7. A photovoltaic cell comprising a region of n-type semiconductive material in intimate contact with a region of p-type semiconductive material, both regions being in contact with conducting electrodes, wherein the n-type semiconductor material and the p-type semiconductor material have lattice parameters which differ from each other by a percentage equal to or greater than 5%, the n-type semiconductor material being CdS containing more than 1% In, and the p-type semiconductor material being Si, the p-type semiconductor material being chosen from mono- and polycrystalline Si having a resistivity of between 100 and 0.01 $\Omega$cm, the n-type semiconductor material being grown by co-evaporation of the substances CdS and In on areas equal to, or wider than 1.5 cm$^2$, and wherein the thickness of the film of the n-type semiconductor material is in the range of 2–10 $\mu$m.

* * * * *